United States Patent [19]
Gersbach et al.

[11] Patent Number: 5,668,503
[45] Date of Patent: Sep. 16, 1997

[54] SYSTEM AND METHOD FOR CALIBRATING DAMPING FACTOR OR ANALOG PLL

[75] Inventors: John Edwin Gersbach, Burlington; Masayuki Hayashi, Williston, both of Vt.

[73] Assignee: International Business Machines Corporation, Armonk, N.Y.

[21] Appl. No.: 645,370

[22] Filed: May 13, 1996

Related U.S. Application Data

[63] Continuation of Ser. No. 542,103, Oct. 12, 1995, Pat. No. 5,563,552, which is a continuation of Ser. No. 189,394, Jan. 28, 1994, abandoned.

[51] Int. Cl.⁶ .................................................. H03L 7/089
[52] U.S. Cl. ........................ 331/1 A; 331/16; 331/17; 331/25; 331/44; 327/157; 327/159
[58] Field of Search ...................... 331/1 A, 25, 16, 331/17, DIG. 2, 44; 327/157, 159

[56] References Cited

U.S. PATENT DOCUMENTS

| | | | |
|---|---|---|---|
| 3,740,671 | 6/1973 | Crow et al. | 333/70 |
| 4,550,292 | 10/1985 | Smith | 331/2 |
| 4,562,411 | 12/1985 | O'Rourke et al. | 331/1 A |
| 4,677,394 | 6/1987 | Vollmer | 331/1 A |
| 4,686,481 | 8/1987 | Adams | 328/133 |
| 4,745,372 | 5/1988 | Miwa | 331/8 |
| 4,814,725 | 3/1989 | Vitiello | 331/1 A |
| 4,926,141 | 5/1990 | Herold et al. | 331/16 |
| 4,952,887 | 8/1990 | Ashley | 331/17 |
| 5,068,626 | 11/1991 | Takagi et al. | 331/17 |
| 5,095,288 | 3/1992 | Dent | 331/17 |
| 5,144,156 | 9/1992 | Kawasaki | 307/262 |
| 5,166,641 | 11/1992 | Davis et al. | 331/1 A |
| 5,180,993 | 1/1993 | Dent | 331/16 |
| 5,339,050 | 8/1994 | Llewellyn | 331/16 |
| 5,563,552 | 10/1996 | Gersbach et al. | 331/1 A |

Primary Examiner—Robert Pascal
Assistant Examiner—Arnold Kinkead
Attorney, Agent, or Firm—Heslin & Rothenberg, P.C.

[57] ABSTRACT

Calibration systems and techniques for analog phase-lock loops (PLLs) providing the capability to dynamically maintain a constant damping factor. Damping factor is calibrated by automatically setting a reference bias current $I_r$ to the PLL's charge pump such that the charge current $I_c$ output therefrom maintains the desired PLL damping characteristic. The technique presented involves selecting a known first frequency $F_1$ and allowing the PLL circuit to reach steady state, after which a known second frequency $F_2$ is applied and the PLL circuit is monitored to determine whether steady state at this second frequency $F_2$ is accomplished within a predetermined target time $T_x$, which corresponds to the desired damping factor. The determination of whether lock occurs within the target time $T_x$ is then employed to automatically setting the reference current $I_r$.

7 Claims, 5 Drawing Sheets

SYSTEM AND METHOD FOR CALIBRATING DAMPING FACTOR OR ANALOG PLL

CROSS-REFERENCE TO RELATED APPLICATIONS

The present application is a continuation application from pending U.S. application Ser. No. 08/542,103, filed on Oct. 12, 1995, now U.S. Pat. No. 5,563,552 entitled "System and Method for Calibrating Damping Factor of Analog PLL," which itself comprises a File Wrapper continuation application of prior U.S. application Ser. No. 08/189,394, filed on Jan. 28, 1994, now abandoned.

TECHNICAL FIELD

The present invention relates in general to phase-locked loops (PLLs), and more particularly, to a closed-loop calibration system and calibration technique for precisely controlling the damping factor of an analog PLL circuit.

BACKGROUND ART

As is well known, a phase-locked loop system produces an output signal which tracks an input signal in frequency and exhibits a fixed phase relationship to the input signal. As the input signal changes in frequency, the output signal likewise changes in such a manner as to maintain the phase relationship between the input and output signals. Originally, phase-locked loops were implemented using only analog techniques. These techniques continue in use today in many data processing and communications systems. An analog phase-locked loop typically consists of four fundamental parts; namely, a phase detector, a charge pump, a filter and a voltage controlled oscillator (VCO).

The phase detector is a device which detects the difference in phase between two input signals, and produces an output signal based thereon. In a phase-locked loop the two inputs to the phase detector are the input to the phase-locked loop and the output signal of the VCO, i.e., the output of the phase-locked loop. The output signal from the phase detector is a digital up/down signal, hereinafter referred to as an error signal. The charge pump produces a source/sink charge current based on the direction of this error signal and the magnitude of a received, fixed reference current. The charge pump outputs the charge current to the filter for establishing a control voltage there across. The filter's control voltage is applied to the input of the VCO. The filter serves to remove any high frequency components from the charge current produced by the charge pump and provides a slowly varying output signal which is representative of the average error in phase between the output signal and the input signal.

The voltage controlled oscillator generates an output signal having a frequency corresponding to the slowly varying control signal across the filter. In one conventional embodiment, the voltage controlled oscillator comprises a voltage to current converter which is coupled through a summing node to an oscillator that provides the output signal from an input current. A fixed bias current is also fed to the summing node. The fixed bias current operates to moderate the gain characteristics of the VCO.

Due to feedback of the output signal to an input of the phase detector, the frequency of the voltage controlled oscillator is adjusted by the VCO input signal, i.e., the control signal across the filter, to maintain the fixed relationship between the input signal and output signal of the PLL.

Component tolerances and process variations often result in a wide range of possible frequency responses at the VCO output of an analog phase-locked loop system. Various PLL calibration techniques are known in the art. For example, center frequency calibration of the output signal is traditionally accomplished by trimming the value of a resistor(s) within the VCO. Unfortunately, this is a difficult and expensive operation, and requires use of circuits which are very temperature stable and insensitive to power supply variations. The gain of a phase-locked loop can also vary significantly with process, temperature and power supply variations. Further, due to technology advances, PLLs are today required to produce higher frequencies while VCO transfer function tolerances become more critical and less achievable simultaneously.

A preferred PLL calibration approach is described in a co-pending application entitled "Calibration Systems and Methods for Setting PLL Gain Characteristics and Center Frequency," Ser. No. 08/173,454, now U.S. Pat. No. 5,382,922, filed Dec. 23, 1993, assigned to the same assignee as the present application, and the entirety of which is hereby incorporated herein by reference. Along with describing a calibration system and method for establishing an analog PLL with zero tolerance center frequency, the co-pending application presents techniques for minimizing VCO gain deviation across the transfer function.

It has been further observed that a PLL's loop damping factor can deviate with the filter components, the gain of the VCO, the charge pump output current, along with process, temperature and power supply variations within a given frequency range. These variations lead to PLL instability which may be intolerable in a particular system design. In addition, as PLL frequency increases, a PLL's damping factor typically declines significantly.

Presently, the PLL damping factor is fixed at time of circuit fabrication by controlling the magnitude of the charge current supplied by the charge pump through a physical trimming of external resistors through which the fixed reference current is supplied to the charge pump. This is successful because the amplitude of the charge pump's source/sink charge current to the filter is proportional to the reference current provided thereto. Such a physical "trimming" approach, however, has the same drawbacks noted above in connection with the conventional "static" technique for trimming resistors within the VCO to set the output signal's center frequency and/or gain.

Thus, a novel, closed-loop calibration technique for periodically, dynamically and precisely controlling an analog PLL's loop damping factor over a wide range of frequencies is needed. Such a calibration technique would allow analog PLL components to be integrated onto a single chip while still retaining good loop stability.

DISCLOSURE OF THE INVENTION

Briefly summarized, the invention comprises in a first aspect a calibration system for a phase-locked loop circuit having a phase comparator connected to a charge pump which receives a reference current $I_r$ and outputs therefrom a proportional charge current $I_c$ to a filter which provides a control voltage $V_c$ to a voltage controlled oscillator (VCO) that provides an output frequency $F_o$. The PLL circuit has a prechosen damping factor $\delta$ which is a function of the charge current $I_c$. The calibration system is responsive to a calibration enable signal 'CAL'. The system includes receiving means for receiving the calibration enable signal 'CAL', and current generation means coupled to the receiving means and to the charge pump. The current generation means includes means for automatically setting the reference current $I_r$ in response to the calibration enable signal 'CAL' such that the prechosen damping factor δ is maintained for the PLL circuit. In one preferred implementation, the calibration system is integrated with the phase-locked loop circuit, and allows automated and repeated calibration of the circuit during time intervals when stable operation of the PLL is not required.

In another aspect, a calibration system for a phase-locked loop (PLL) circuit is presented which is responsive to a calibration enable signal 'CAL'. The PLL circuit has a charge pump which receives a reference current $I_r$ and outputs therefrom a proportional source/sink charge current $I_c$. The PLL circuit further has a prechosen damping factor δ which is a function of the charge current $I_c$. The calibration system includes means for applying a known first frequency $F_1$ to the PLL circuit output and allowing the PLL circuit to reach steady state and, thereafter, means for applying a known second frequency $F_2$ to the PLL circuit and monitoring whether the PLL circuit reaches steady state at the known second frequency $F_2$ within a predetermined target time $T_x$. The means for monitoring includes means for generating a LOCK signal corresponding to whether the PLL circuit reaches steady state at the known second frequency within the predetermined target time $T_x$. Means, employing the LOCK signal, is provided for automatically setting the reference current $I_r$ such that the prechosen damping factor δ is maintained for the PLL circuit.

In other aspects, methods for calibrating a phase-locked loop (PLL) circuit are presented. The PLL circuit has a phase comparator coupled to a charge pump which receives a reference current $I_r$ and outputs therefrom a proportional source/sink charge current $I_c$ to a filter which provides a control voltage $V_c$ to a voltage controlled oscillator (VCO) that outputs a frequency signal $F_0$. The PLL circuit has a prechosen damping factor δ which is a function of the charge current $I_c$. In a general aspect, the calibrating method responds to a calibration enable signal 'CAL' and comprises the steps of: receiving the calibration enable signal 'CAL'; and automatically setting the reference current $I_r$ in response to the calibration enable signal 'CAL' received such that the prechosen damping factor δ is maintained for the PLL circuit.

In another aspect, a calibrating method in accordance with the invention includes: selecting a known first frequency $F_1$ and allowing the PLL circuit to reach steady state at the known first frequency $F_1$; selecting a known second frequency $F_2$ and determining whether the PLL circuit reaches steady state at the known second frequency $F_2$ within a predetermined target time $T_x$ and providing a LOCK signal representative of whether the PLL circuit reaches steady state at the known second frequency within the predetermined target time $T_x$; and using the LOCK signal to automatically set the reference current $I_r$ such that the prechosen damping factor δ is maintained for the PLL circuit.

To restate, a calibration system and method for dynamically maintaining a prechosen damping factor within an analog phase-locked loop is presented. The approach set forth eliminates damping factor variations as a function of temperature and power supply voltages, as well as due to component tolerances, so that exact calibration of the PLL damping factor is possible. Automated, repeated calibration of the PLL circuit is anticipated using the integrated, digital circuit described. By eliminating damping factor variations, PLL system performance can be maintained.

BRIEF DESCRIPTION OF DRAWINGS

These and other objects, advantages and features of the present invention will be more readily understood from the following detailed description of certain preferred embodiments of the present invention, when considered in conjunction with the accompanying drawings in which.

BEST MODE FOR CARRYING OUT THE INVENTION

Figure 1:
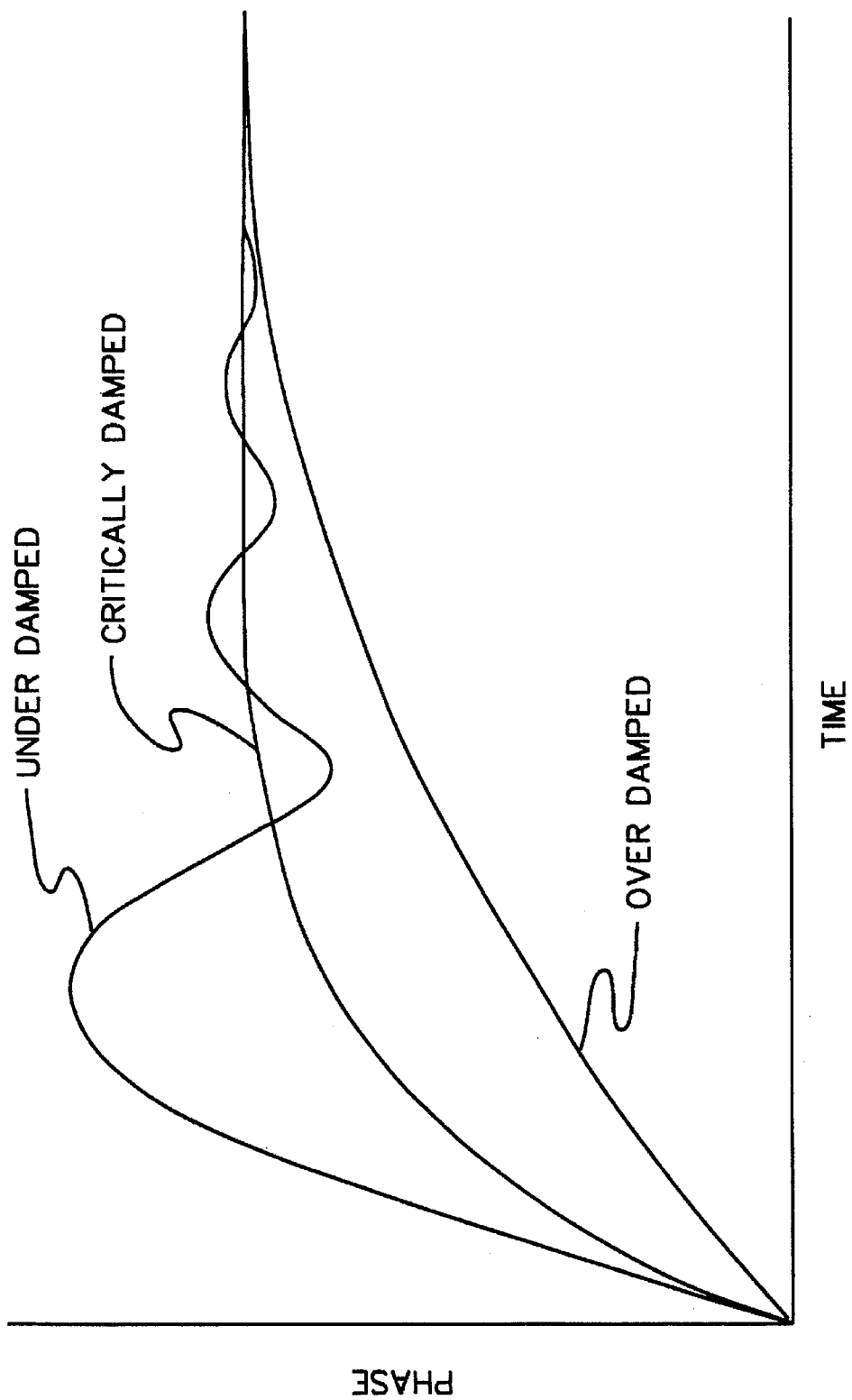
FIG. 1 is a graph of PLL output phase change in response to an input phase change for an under damped PLL, an over damped PLL and a critically damped PLL.

A PLL's damping factor δ determines the transient response of the phase-locked loop to a change in the input frequency or a disturbance within the loop. As shown in FIG. 1, a high damping factor produces a slow PLL response (over damped), while a low damping factor causes overshoot and ringing at the PLL output (under damped). In either case, the time required for the PLL to reach steady state is longer than the optimum time, which occurs when the PLL is critically damped. A goal of the present invention is to provide an automated real time system and technique for periodically, thus dynamically, calibrating an analog PLL circuit to a prechosen damping factor. The scheme presented permits the PLL and calibration circuits to be integrated onto a single chip while still retaining good loop stability.

Figure 2:
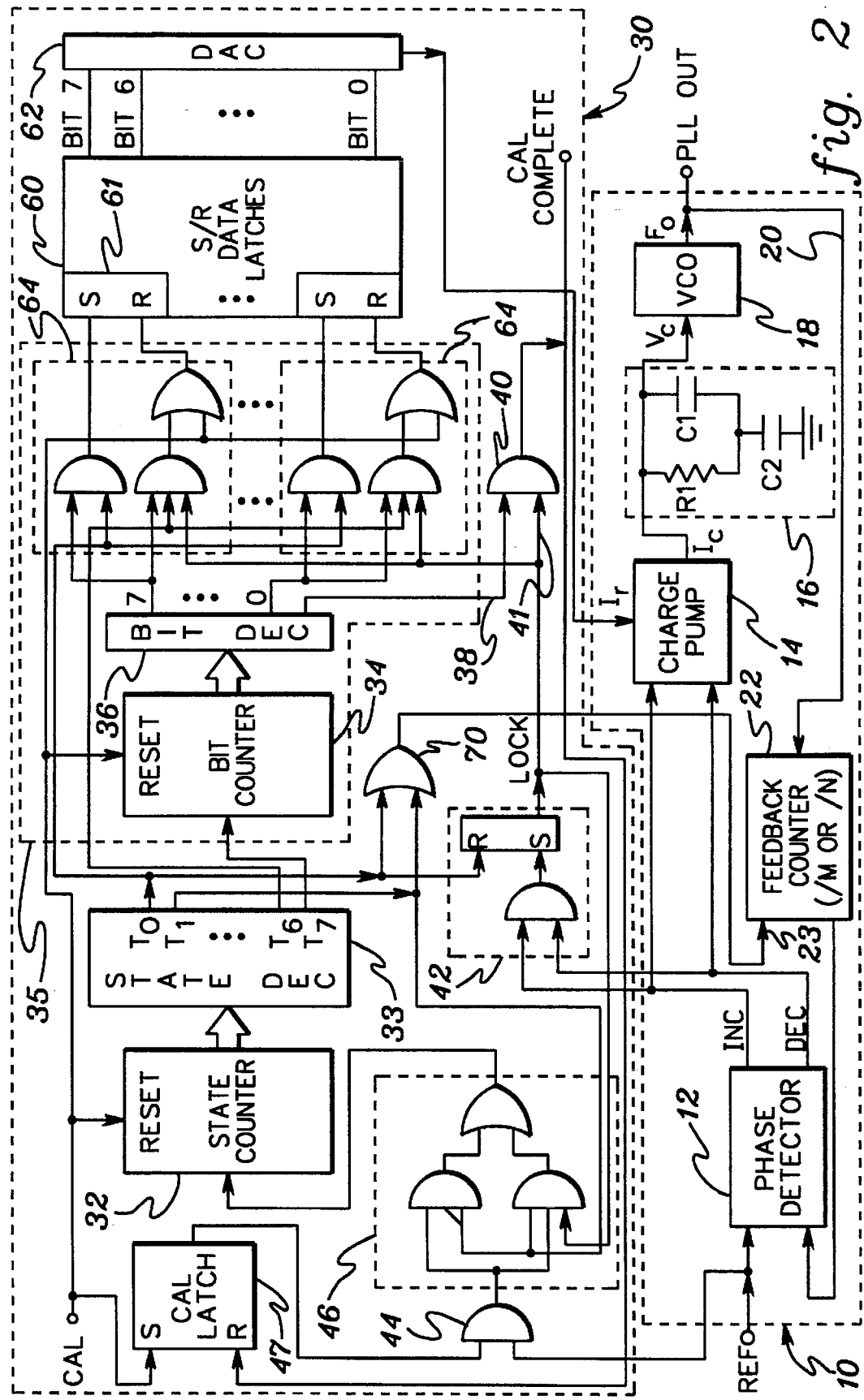
FIG. 2 is a schematic of one embodiment of an integrated phase-locked loop and calibration system in accordance with the invention.

FIG. 2 depicts an integrated PLL 10 and self-calibration system 30 in accordance with the invention. This integrated system embodiment functions by automatically setting the charge pump reference current $I_r$, and thus the magnitude of the charge pump's output $I_c$, using known filter component values and a desired PLL output frequency. The PLL loop damping factor can be calibrated to a narrow range, such as, between 0.5 and 1.0. In operation, calibration system 30 implements a successive approximation process, and provides an automated, repetitive approach to calibrating the PLL's damping factor.

Referring to FIG. 2, PLL 10 includes a phase comparator 12 which is coupled through a charge pump 14, and a filter 16, to a voltage controlled oscillator (VCO) 18, which has a control voltage $V_c$ input and a frequency output $F_0$. Filter voltage $V_c$ at the input to VCO 18 is controlled by a source/sink charge current $I_c$ provided to filter 16 by charge pump 14. The magnitude of charge current $I_c$ is proportional to, and possibly the same as, the magnitude of the reference current $I_r$ received from calibration system 30. Whether charge pump 14 sources or sinks current is determined by the direction of phase offset noted by phase detector 12, i.e., whether an increment 'INC' or a decrement 'DEC' error signal is output from detector 12 to charge pump 14. Again, the error signal is based on the phase difference between the inputted reference signal 'REF' and the VCO frequency output $F_0$. Frequency output $F_0$ is fed back to phase detector 12 via a feedback line 20, which passes through a feedback counter 22, such that PLL 10 is a closed-loop circuit. Counter 22 comprises an adjustable feedback divider which can be set by calibration system 30 to either a divide by M "/M" or a divide by N "/N". In the embodiment discussed herein, M is arbitrarily chosen to equal N/2.

Calibration system 30 is integrated with PLL 10 to monitor the loop damping factor and adjust the reference current $I_r$ to the charge pump such that the damping factor is maintained at a desired level notwithstanding frequency changes or other variations within the phase-locked loop. As shown below, the PLL's damping factor $\delta$ is a function of the charge current $I_c$ provided by charge pump 14, which itself is proportional to the received reference current $I_r$. Thus, by modifying the amplitude of the reference current $I_r$, the loop damping factor $\delta$ is controlled. Calibration adjustment can be accomplished during any time period when stable operation of the PLL is not required.

Calibration system 30 includes two counters, namely, a state counter 32 and a bit counter 34. State counter 32 implements a series of steps to calibrate each bit of a plurality of bits at the output of a bit decoder 36 connected to bit counter 34. Taken together, the series of steps or states comprise a "calibration bit cycle". Counter 34 preferably counts sequentially such that each bit output from decoder 36 is selected beginning with an highest order bit, which in this example comprises BIT 7. Bit counter 34 and decoder 36 each have an extra bit output on line 38 to indicate completion of the calibration process after all bits have been calibrated as described below. This bit is output to an AND gate 40 which also receives as input a LOCK signal on line 41 from a PLL lock detector logic 42. Logic 42 detects the presence of a steady state condition within PLL 10, which occurs when INC and DEC pulses are simultaneously output from the phase detector.

Figure 3:
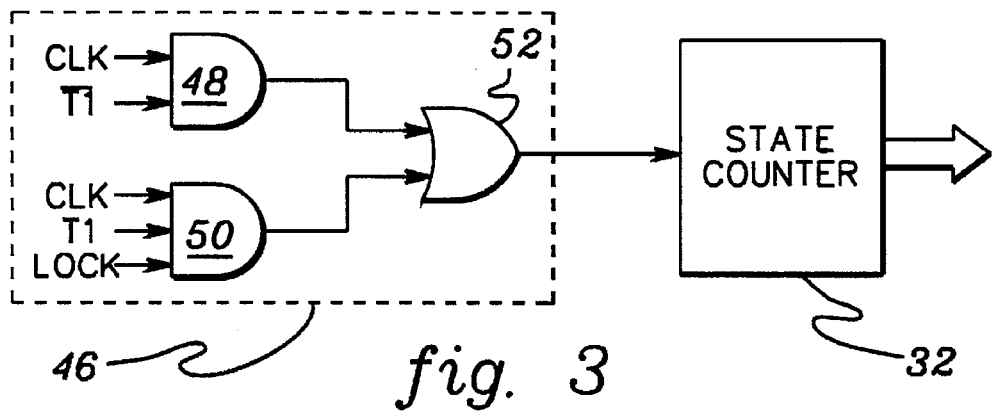
FIG. 3 is a more detailed schematic of the state counter of FIG. 2 and its state control logic at an input thereto.
Figure 7:
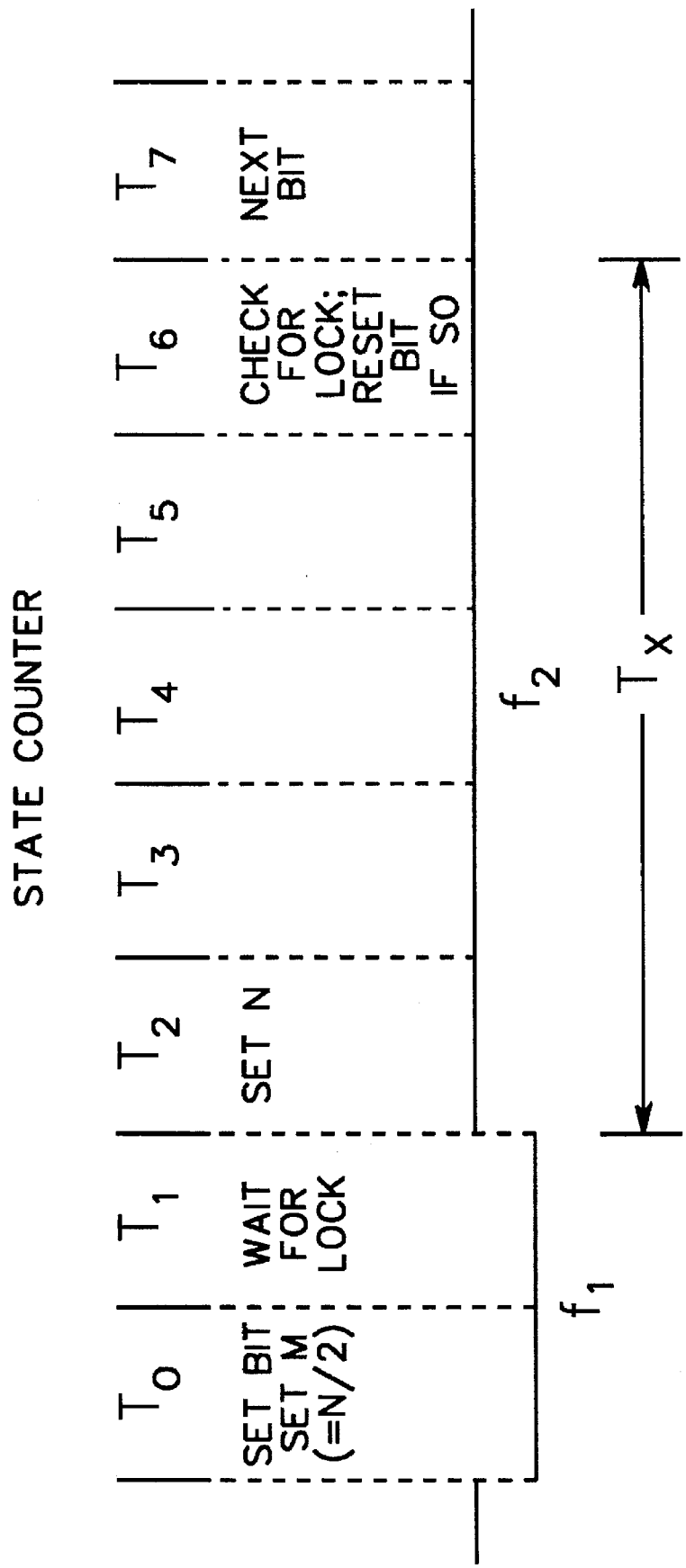
FIG. 7 is a timing diagram useful in describing "calibration bit cycle" processing in accordance with the invention.

In this example, state counter 32 defines STATES $T_0$ through $T_7$, one embodiment of which is depicted in FIG. 7. Counter 32 is driven by an accurate time reference such as a crystal oscillator. By way of example, the same reference 'REF' signal can be used to drive the calibration process as for normal PLL operation. The signal is received by state counter 32 through AND logic 44 and clock control logic 46 whenever a 'CAL' latch 47 is set by a calibration enable signal 'CAL'. Control logic 46 is depicted in greater detail in FIG. 3. Clock control logic 46 includes a two-input AND gate 48 and a three input AND gate 50. Gate 48 receives a clock pulse 'CLK' through AND gate 44 (FIG. 2) and an inverted STATE $T_1$ output signal from a state decoder 33 connected to the output of state counter 32. Input to AND gate 50 is the clock signal 'CLK', the STATE $T_1$ signal and the LOCK signal. The outputs from AND gates 48 & 50 are combined in OR logic 52, the output of which drives state counter 32.

As described in greater detail below, a time interval is prechosen, e.g., the interval of time between STATE $T_2$ and STATE $T_7$, within which the PLL should reach steady state condition for a defined change in frequency. This time interval is referred to herein as the target time $T_x$ and is representative of a desired PLL damping factor, e.g., corresponding to a critically damped circuit. Processing according to the invention proceeds one bit at a time, preferably from a highest order bit to a lowest order bit. Thus, starting with a highest order bit at the output of bit decoder 36, herein BIT 7, a corresponding latch 61 in S/R data latches 60 is set. This set latch is translated by a digital to analog converter (DAC) 62 into an analog current, which comprises a test reference current $I_r$ fed to charge pump 14 during the corresponding calibration bit cycle of the calibration process.

Figure 4:
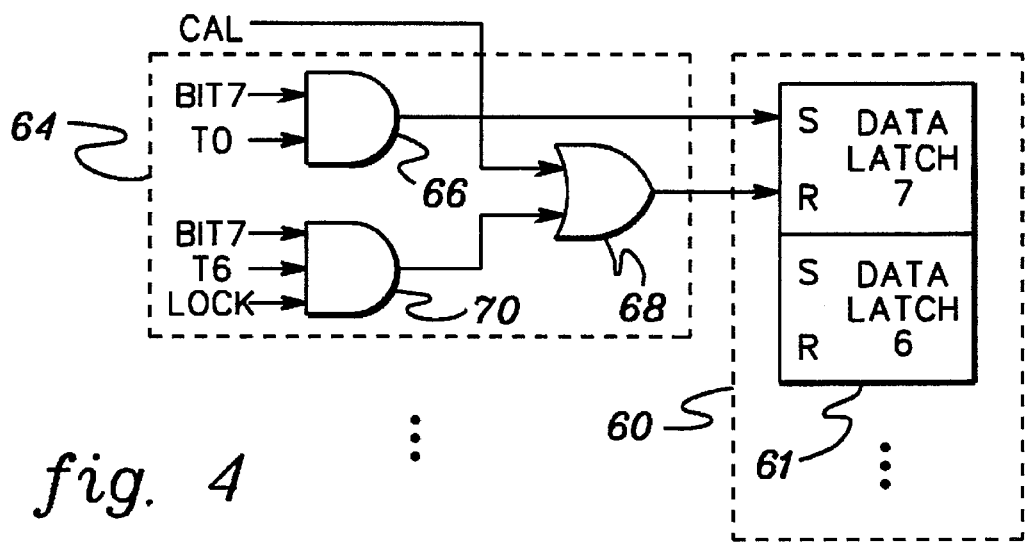
FIG. 4 is a more detailed schematic of the S/R data latches of FIG. 2 and the set/reset control logic at the inputs thereto.

As best shown in FIG. 4, the S/R data latches 60 each have a dedicated set/reset control circuit 64 connected thereto. The set/reset control circuit 64 for S/R DATA LATCH 7 61 includes a two-input AND gate 66, which is connected to drive the set input 'S' of data latch 61. AND gate 66 receives at one input the BIT 7 signal output from bit decoder 36 and at its other input the STATE $T_0$ signal output from state decoder 33. The reset input 'R' to data latch 61 is driven by the output of a two-input OR gate 68, which receives at one input the calibration enable signal 'CAL' and at its other input the output of a three-input AND gate 70. For DATA LATCH 7 61, three-input AND gate 70 receives the BIT 7 signal output from bit decoder 36, the STATE $T_6$ signal output from state decoder 33 and the LOCK signal output from lock detect logic 42. The STATE $T_6$ and LOCK signals are common to all three-input AND gates in the respective set/reset control logic 64 blocks. Thus, bit reset is accomplished at the end of a corresponding "calibration bit cycle" only if the PLL has achieved steady state condition.

Figure 5:
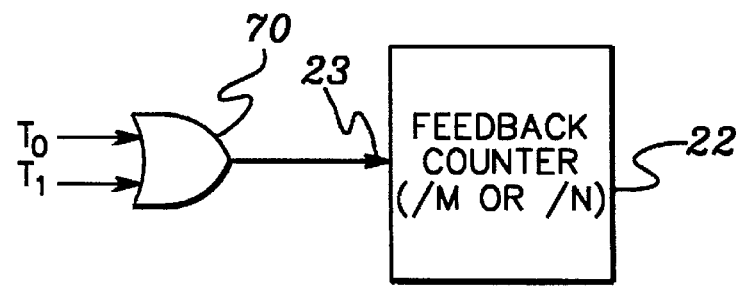
FIG. 5 is a more detailed schematic of the feedback counter of FIG. 2 and the selection logic at a control input thereto.

For each calibration bit cycle, the PLL 10 is initially offset in frequency by a factor of, for example, two to establish a starting point (frequency $F_1$, from which to compare a lock time $T_L$ to the chosen target time $T_x$. This can be accomplished by modifying the "divide by" value of counter 22 within feedback loop 20 of PLL 10. For example, M might be defined as one-half N. As shown in FIG. 5, a select input 23 to feedback counter 22 is controlled by the output of a two-input OR gate 70. OR gate 70 is coupled to receive STATE $T_0$ and STATE $T_1$ signals from state decoder 33 at the output of state counter 32. After lock is achieved, the counter 22 is returned to its original value (e.g., /N). This occurs at the beginning of STATE $T_2$, and the target time $T_x$ commences (see FIG. 7). If LOCK is achieved by PLL 10 to frequency $F_2$ prior to the end of STATE $T_6$, the bit in question is reset to "0". Otherwise, the bit remains in a "1" state, i.e., the bit is correct and bit counter 34 is stepped to a next lower order bit at the start of STATE $T_7$. This "calibration bit cycle" process is then repeated until all bits have been considered.

The period of each STATE $T_0$–$T_7$ output from state decoder 33 is preferably fixed, and may be equal, except for STATE $T_1$. This particular STATE period is determined by the initial lock time required by PLL 10 to reach steady state at frequency $F_1$ with a /M counter value. The PLL system must be in steady state for this first frequency output $F_0$(M) in order to set up for the 'lock-in' time evaluation. The period of STATE $T_1$ will be a multiple of the reference clock 'REF' period, at least in the example presented. A lock condition is detected by circuit 42, which outputs a LOCK signal based thereon. When the phase-locked loop is in steady state, phase detector 12 produces simultaneous pulses on both the increment 'INC' and decrement 'DEC' output lines.

The calibration logic is driven by an electrical calibration enable signal 'CAL' received from an associated control system (not shown) which may either be on-chip or external to the chip containing the phase-locked loop. Provision of this signal starts the calibration process. It is significant to note that the present invention preferably comprises an "automated" technique for periodically adjusting calibration of the PLL's damping factor. Manual assistance is not required to implement the calibration process; rather, repeated on-line calibration is anticipated.

Figure 6:
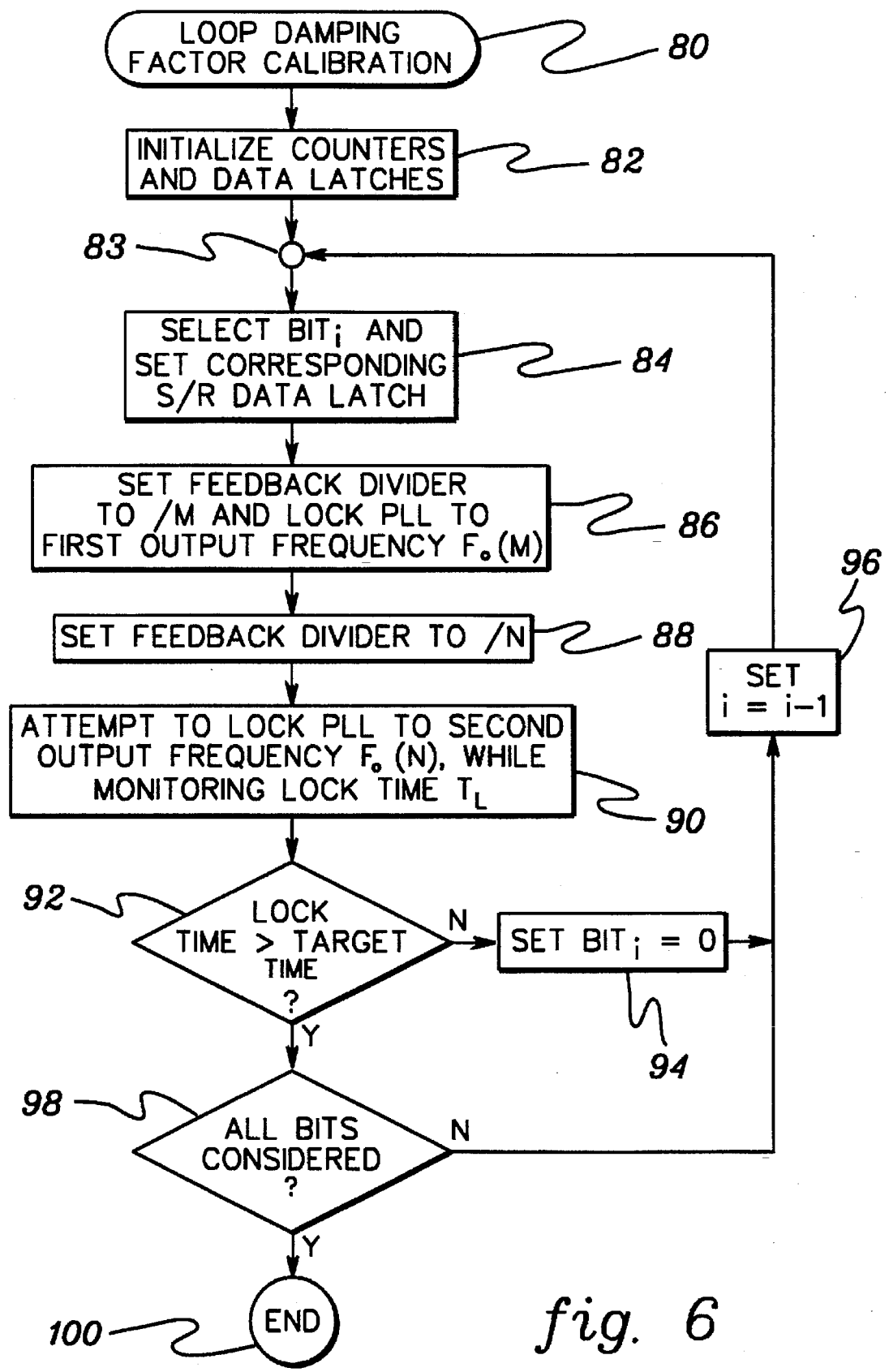
FIG. 6 is a flowchart of one embodiment of automated PLL calibration processing in accordance with the invention.

One embodiment of processing in accordance with the invention is set forth in FIG. 6. Upon receipt of a calibration enable signal 'CAL', calibration of the PLL's damping factor is commenced, 80 "Loop Damping Factor Calibration," by initializing the state counter and the bit counter, 82 "Initialize Counters and Data Latches." Essentially, all counter outputs are zeroed, along with all S/R data latches. One bit of the bit decoder output of the calibration system is selected for initial consideration, 84 "Select Bit$_i$ And Set Corresponding S/R Data Latch." As discussed, the first selected bit for consideration is preferably the highest order bit, which in this example comprises BIT 7. A "calibration bit cycle" (FIG. 7) defined by the successive states of state counter 32 is then executed for the selected bit.

Specifically, within the first two STATE intervals $T_0$ & $T_1$, the feedback divider is set to 'divide by M' and the calibration system awaits locking of the PLL to the first output frequency $F_1$, 86 "Set Feedback Divider To /M And Lock PLL To First Output Frequency $F_0(M)$." After achieving a lock condition, the feedback divider is reset to 'divide by N', 88 "Set Feedback Divider To /N," after which the PLL attempts to reach steady state condition for this new output frequency $F_2$, 90 "Attempt To Lock PLL To Second Output Frequency $F_0(N)$, While Monitoring Lock Time $T_L$."

In this example, the time interval between the beginning of STATE $T_2$ and the end of STATE $T_6$ has been prechosen as a target time within which the PLL should achieve lock condition for output frequency $F_0(N)$. Processing next considers whether the lock time $T_L$ is greater than the target time $T_x$, 92 "Lock Time>Target Time?" If "No," then the selected bit, BIT$_i$, is cleared or zeroed, 94 "Set Bit$_i$=0." Thereafter, a new bit is selected during STATE $T_7$ for consideration in the next calibration bit cycle, 96 "Set i=i-1," and 84 "Select BIT$_i$ And Set Corresponding S/R Data Latch." Processing then continues for the new bit within the next calibration bit cycle as noted above.

If the PLL did not lock within the target time interval $T_x$, then BIT$_i$ remains set and processing determines whether all bits have been considered, 98 "All Bits Considered?" If "No," then "i" is again decremented and a next bit is selected. Otherwise, calibration processing is complete, 100 "End."

The target time $T_x$ can be empirically selected by one of ordinary skill in the art when designing an integrated PLL and calibration system in accordance with this invention. The time interval from the beginning of STATE $T_2$ to the end of STATE $T_6$ is selected in the example presented. This interval would be a multiple of the period of the clocking reference signal 'REF'. As noted initially, the number of states in the state counter is independent from the number of bits of the bit counter.

For completeness, the lock time $T_L$ can be mathematically related to the PLL's damping factor in order to validate the presented calibration approach. The PLL 10 configuration presented in FIG. 2 is a common configuration and its damping factor can be expressed as set forth in Equation (1):

$$\delta = \frac{R1*(C1+C2)}{2} *((I_c/C2)*(K_{VCO}/2\pi N))^{.5} \quad (1)$$

Wherein:

R1, C1 & C2 are filter components;

N=ratio of the VCO frequency $F_0$ to the input reference frequency 'REF' due to the feedback counter;

$I_c$=the magnitude of the charge pump current; and $K_{VCO}$=the VCO gain which has been precalibrated to a known value.

Since component C2 is large and the time constant R1×C1 is relatively short, the current pulses become short with respect to R1×C1 as the loop approaches steady state condition. Thus, the approximation of Equation (2) can be made. Wherein:

$$I_c C2 = dV/dT \quad (2)$$

dV=is the filter voltage difference required to produce a factor of two difference in the VCO frequency; and dT=is the lock time required by the PLL to reach steady state condition.

Making the substitution of Equation (2) into Equation (1), and solving for the desired time leads to Equation (3):

$$dT = \frac{A*K_{VCO}*dV}{2*\pi*N} *((R1*(C1+C2))/2*\delta)^2 \quad (3)$$

Wherein:

A=is a predictable constant that is introduced to account for the fact that the charge pump is not on continuously during the lock time.

Those skilled in the art will note from the above discussion that the present invention encompasses calibration systems and methods for dynamically maintaining a prechosen damping factor within an analog phase-locked loop. The approach presented eliminates damping factor variations as a function of temperature and power supply voltages, as well as due to component tolerances, so that exact calibration of the PLL damping factor is possible. Automated, repeated calibration of the PLL circuit is anticipated using the integrated digital circuits described. By eliminating damping factor variations, PLL system performance is maintained.

Although specific embodiments of the present invention have been illustrated in the accompanying drawings and described in the foregoing detailed description, it will be understood that the invention is not limited to the particular embodiments described herein, but is capable of numerous rearrangements, modifications and substitutions without departing from the scope of the invention. The following claims are intended to encompass all such modifications.

We claim:

1. A calibration system for a phase-locked loop (PLL) circuit having a plurality of components, said components including a phase comparator connected to a charge pump which receives a reference current $I_r$ and outputs therefrom proportionately to the reference current $I_r$ charge current $I_c$ to a filter which provides a control voltage $V_c$ to a voltage controlled oscillator (VCO) that provides an output frequency $F_0$, the PLL circuit having a damping factor δ which is a function of the charge current $I_c$, said calibration system being responsive to a calibration enable signal 'CAL', at least one component of said plurality of components having a component value within a predefined tolerance, said calibration system comprising:

receiving means for receiving the calibration enable signal 'CAL';

sensing means for dynamically determining the damping factor δ; and current generation means coupled to the receiving means, the sensing means and to the charge pump, said current generation means including means for automatically setting the reference current $I_r$ in response to the calibration enable signal 'CAL' and the dynamically determined damping factor δ such that a pre-chosen damping factor δ value is dynamically maintained notwithstanding variation of the component value of that least one component within its predefined tolerance due to process, temperature or power supply variation.

2. The calibration system of claim 1, wherein said means for automatically setting the reference current $I_r$ includes a digital to analog converter having a plurality of binary weighted input bits and an analog current output based on active ones of the binary weighted input bits, the analog output current of said digital to analog converter comprising the reference current $I_r$.

3. The calibration system of claim 1, wherein the pre-chosen damping factor $\delta$ value comprises a damping factor range, and wherein said damping factor range comprises 0.5 to 1.0.

4. An integrated phase-locked loop (PLL) and calibration system responsive to a calibration enable signal 'CAL' for maintaining a damping factor $\delta$ of the PLL at a constant value, said integrated system comprising:

- a phase detector means for comparing the phases of an output signal of the PLL and a reference input signal to produce an error signal based on any phase difference;
- a charge pump coupled to receive the error signal and a reference current signal $I_r$, said charge pump ouputting of a source/sink direction a charge current $I_c$ proportional to the reference current $I_r$ and having a direction determined by the error signal;
- a filter coupled to receive the charge current $I_c$ and provided therefrom a voltage control signal $V_c$;
- a voltage controlled oscillator (VCO) coupled to the filter to receive at an input the voltage control signal $V_c$ and generate therefrom a frequency output $F_0$, the frequency output $F_0$ of the VCO comprising an output signal of the PLL;
- at least one of said charge pump, said filter and said VCO having a component value within a predefined tolerance;
- sensing means for dynamically determining the damping factor $\delta$ of the PLL; and
- current generation means coupled to the sensing means and the charge pump for generating the reference current $I_r$, said current generation means including means for automatically calibrating the reference current $I_r$ in response to the calibration enable signal 'CAL' and the dynamically determined damping factor $\delta$ such that the damping factor $\delta$ of the PLL is automatically dynamically maintained at said constant value notwithstanding variation of the component value within its predefined tolerance due to process, temperature or power supply variation.

5. The integrated system of claim 4, wherein said means for automatically setting the reference current $I_r$ includes a digital to analog converter having a plurality of binary weighted input bits and an analog current output based on active ones of the binary weighted input bits, the analog current output of the digital to analog converter comprising the reference current $I_r$.

6. A method for calibrating a phase-locked loop (PLL) circuit in response to a calibration enable signal 'CAL', the PLL circuit having a plurality of components including a phase comparator coupled to a charge pump which receives a reference current $I_r$ and outputs therefrom a proportional source/sink charge current $I_c$ to a filter which provides a control voltage $V_c$ to a voltage controlled oscillator (VCO) that outputs a frequency signal $F_0$, the PLL circuit having a damping factor $\delta$ which is a function of the charge current $I_c$, at least one component of said plurality of components having a component value within a predefined tolerance, said calibrating method comprising the steps of:

(a) receiving the calibration enable signal 'CAL';

(b) dynamically sensing the damping factor $\delta$ of the PLL; and (c) automatically adjusting the reference current $I_r$ in response to the calibration enable signal 'CAL' received in said step (a) and the damping factor $\delta$ dynamically sensed in said step (b) such that the damping factor $\delta$ is maintained at a pre-chosen constant value notwithstanding variation of the component value of the at least one component within its predefined tolerance due to process, temperature or power supply variation.

7. The calibrating method of claim 6, further comprising the step of periodically repeating said steps (a), (b) & (c).

* * * * *

UNITED STATES PATENT AND TRADEMARK OFFICE
CERTIFICATE OF CORRECTION

PATENT NO. : 5,668,503

DATED : September 16, 1997

INVENTOR(S) : Gersbach et al.

It is certified that error appears in the above-identified patent and that said Letters Patent is hereby corrected as shown below:

Title page, item [54] and col. 1, line 2, in
    Title -   "OR" should read --OF--.

Claim 1, column 8, line 66 -   "that" should read --the at--.

Claim 4, column 9, line 25 -   "provided" should read --provide--.

Signed and Sealed this

Twenty-fourth Day of February, 1998

Attest:

BRUCE LEHMAN

*Attesting Officer*            *Commissioner of Patents and Trademarks*